United States Patent [19]

Rabaey

[11] Patent Number: 4,600,901

[45] Date of Patent: Jul. 15, 1986

[54] SWITCHED CAPACITANCE FEEDBACK CONTROL CIRCUIT AND SIGMA-DELTA MODULATOR USING SAME

[75] Inventor: Dirk H. L. C. Rabaey, Borgerhout, Belgium

[73] Assignee: International Standard Electric Corporation, New York, N.Y.

[21] Appl. No.: 711,704

[22] Filed: Mar. 14, 1985

[51] Int. Cl.[4] .............................................. H03K 7/00

[52] U.S. Cl. ................................ 332/11 D; 332/9 T; 375/28

[58] Field of Search .................... 332/11 D, 9 R, 9 T; 375/27, 28, 29

[56] References Cited

U.S. PATENT DOCUMENTS 4,504,803 3/1985 Lee et al. ........................ 332/9 R X

*Primary Examiner*—Eugene R. LaRoche
*Assistant Examiner*—James C. Lee
*Attorney, Agent, or Firm*—John T. O'Halloran; Jeffrey P. Morris

[57] ABSTRACT

The present invention discloses a feedback control circuit in which the input and feedback signals are processed by making use of the same capacitance so that there is no problem of capacitance matching. Another aspect of the invention is a sigma-delta modulator in which the processing means includes integration means which are able to integrate said sampled and added input and feedback signals and to provide an analog output signal, a one-bit analog-to-digital converter providing a digital output signal in response to said analog output signal, and a one-bit digital-to-analog converter providing said feedback signal in response to said output signal, said input signal being sampled and simultaneously said converters being operated by and during first of said timing signals, while by and during second of said timing signals said feedback signal is sampled and said input and feedback signals are added and integrated, said first and second timing signals being non-overlapping and defining a sampling period. Thus a relatively long time is available for the sampling of the input and feedback signals as well as for the operation of the converters, even when the sampling period is relatively short.

6 Claims, 2 Drawing Figures

SWITCHED CAPACITANCE FEEDBACK CONTROL CIRCUIT AND SIGMA-DELTA MODULATOR USING SAME

BACKGROUND OF THE INVENTION

1. Field of the Invention

The present invention relates to a switched capacitance feedback control circuit including the cascade connection of switched capacitance signal input means and signal processing means, said input means including timing means providing timing signals, capacitance means and switching means controlled by said timing means, and said input means being able to sample and algebraically add an analog input signal and an analog feedback signal provided by said processing means. 2. Description of the Prior Art Such a control circuit is already known from U.S. Pat. No. 4,439,756. Therein the capacitance means include two capacitances which are used in the input means for sampling the input and the feedback signal respectively, so that to have an accurate operation of the control circuit both these capacitances should have exactly the same value. This is difficult to be realized.

SUMMARY OF THE INVENTION

An object of the present invention is to provide a feedback control circuit of the above type, but with a more accurate performance.

According to the invention this object is achieved due to that fact that said capacitance means include a single capacitance.

Thus the input and feedback signals are processed by making use of the same capacitance so that there is no problem of capacitance matching.

The present invention also includes to a sigma-delta modulator for digitally encoding an analog input signal. This modulator is characterized in that it includes a switched capacitance feedback control circuit as described above.

Another aspect of the present sigma-delta modulator is that said processing means include integration means which are able to integrate said sampled and added input and feedback signals and to provide an analog output signal, a one-bit analog-to-digital converter providing a digital output signal in response to said analog output signal, and a one-bit digital-to-analog converter providing said feedback signal in response to said output signal, said input signal being sampled and simultaneously said converters being operated by and during first of said timing signals, whilst by and during second of said timing signals said feedback signal is sampled and said input and feedback signals are added and integrated, said first and second timing signals being non-overlapping and defining a sampling period.

Thus a relatively long time is available for the sampling of the input and feedback signals as well as for the operation of the converters, even when the sampling period is relatively short.

It should be noted that in the above mentioned U.S. Pat. No. 4,439,756 a sigma-delta modulator is described which includes a switched capacitance feedback control circuit such as described in the above first paragraph and with processing means including integration means which are able to integrate the sampled and added input and feedback signals and to provide an analog output signal, a one-bit analog-to-digital converter providing a digital output signal in response to said analog output signal, and a one-bit digital-to-analog converter providing said feedback signal in response to said output signal.

In this known modulator the analog-to-digital or AD converter is constituted by an analog comparator followed by a D-flipflop and the digital-to-analog or DA converter comprises gating means. The comparator, the D-flipflop and the DA converter are operated during distinct first, second and third(the charge time interval) time periods of a first time interval of a sampling period which further includes a second time interval (the discharge time interval). During the third time period also the input and the feedback signals are sampled and stored in the above mentioned two capacitances, and during the second time interval the input and feedback signals are added and integrated. Because the comparator and the flipflop are operated during successive distinct time periods it might happen, in case the sampling frequency is relatively high, e.g. 1 MHz, that one or both these time periods is or are too short so that the output signal of the comparator is not yet stabilized at the moment it is registered in the flipflop or/and that the output signal of this flipflop is not yet stabilized at the moment it is applied to the gating means. Obviously, in these cases the accuracy of the modulator is adversely affected.

The above mentioned and other objects and features of the invention will become more apparent and the invention itself will be best understood by referring to the following description of an embodiment taken in conjunction with the accompanying drawings wherein :

DESCRIPTION OF THE PREFERRED EMBODIMENT

Figures 1, 2:
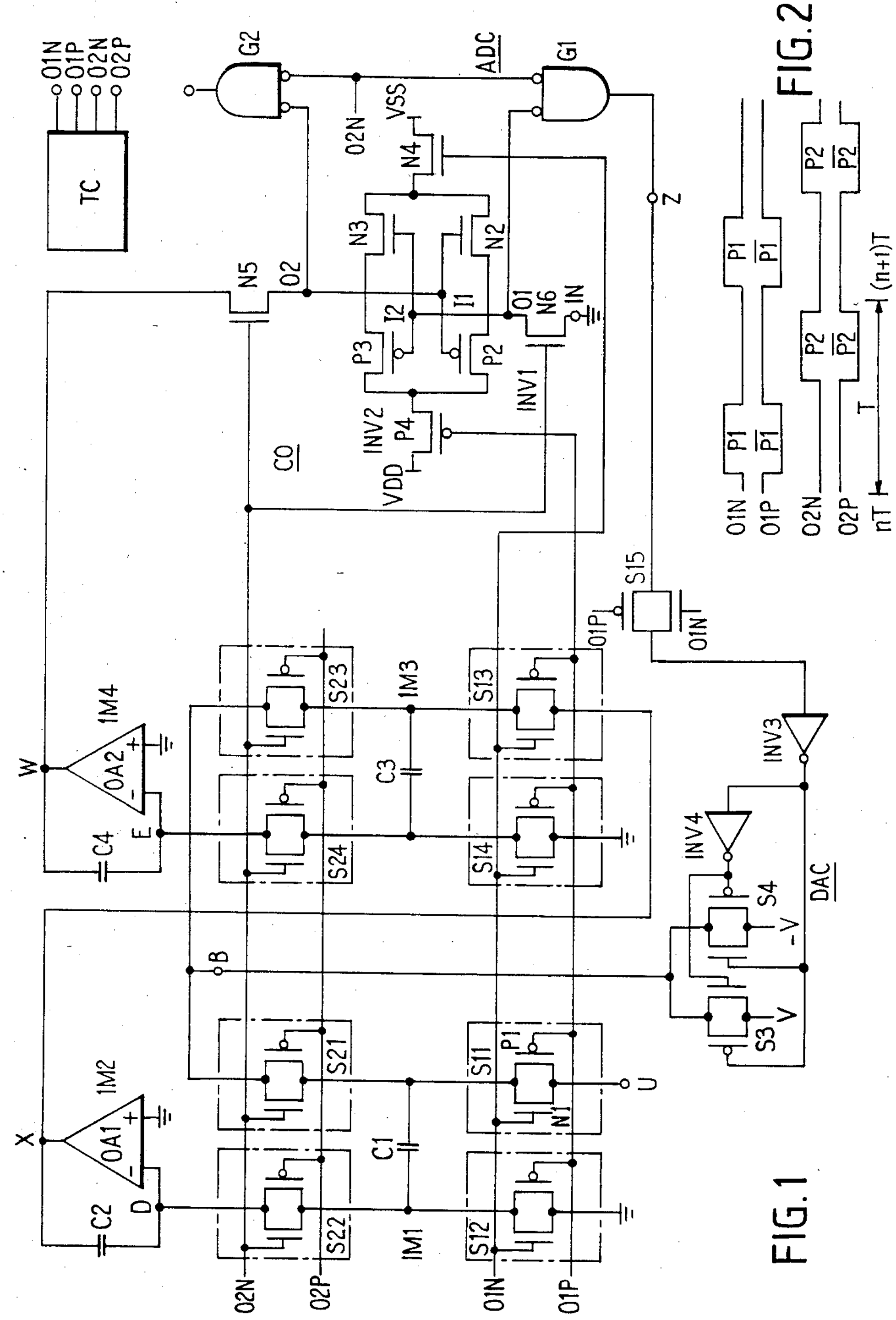
FIG. 1 is a schematic diagram of a switched capacitor feedback control circuit according to the invention.
FIG. 2 represents timing pulse waveforms generated by timing circuit TC of FIG. 1.

The switched capacitor feedback control circuit shown is a sigma-delta of the type disclosed in the above mentioned U.S. Pat. No. 4,439,756. This modulator is controlled by timing pulse waveforms O1N, O1P, 02N and 02P generated by a timing circuit TC and represented on FIG. 2. O1N and O1P as well as O2N and OP2 are complementary waveforms and O1N, O1P are non-overlapping with respect to 02N, 02P. Each of these pulse waveforms has a frequency of 1 MHz or a sampling period T of 1 microsecond, the timing pulses P1, P1, P2, P2 having a duration equal to $\frac{3}{8}$ T.

The forward path of the feedback control circuit has a signal input U and a signal output Z and includes the cascade connection of first input means IM1 with input U, feedback signal input B and output D, first integration means IM2 with input D and output X, second input means IM3 with input X, feedback input B and output E, second integration means IM4 with input E and output W; and one-bit analog-to-digital converter ADC with input W and output Z. The feedback path of this control circuit comprises a one-bit digital-to-analog converter DAC coupled between the last mentioned output Z and the above feedback inputs B of both the first and second input means IM1 and IM3.

The first input means IM1 include a sampling capacitor C1 and associated electronic switches S11, S12 and S21, S22 and the first integrator means comprise an operational amplifier OA1 and a capacitor C2. Each of these switches is constituted by a PMOS transistor and by an NMOS transistor with interconnected source and drain electrodes and with gate electrodes controlled by the above mentioned complementary pulse waveforms O1N, O1P or 02N, 02P. For instance, switch S11 comprises PMOS transistor P1 and NMOS transistor N1 whose source and drain electrodes are interconnected and whose gate electrodes are controlled by O1P and O1N respectively. The inputs U and B are connected through respective switches S11 and S21 to one plate of capacitor C1 whose other plate is connected to a reference voltage, e.g. more particularly ground, via switch S12 and through switch S21 with the inverting input D of the operational amplifier OA1. The latter has non-inverting input connected to the same reference voltage, i.e. ground, as S12. The integrating capacitor C2 is connected between the inverting input D and the output X of the amplifier OA1.

The second input means IM3 are identical to the above first integrating means IM1 and include a sampling capacitor C3 and associated electronic switches S13, S14 and S23, S24 and the second integration means IM4 comprise an operational amplifier OA2 and an integrating capacitor C4.

The one-bit analog-to-digital converter ADC includes a comparator CO which is of the same type as the one disclosed in Belgian Pat. No. 897 771 (D. RABAEY et al 1-1). This comparator CO has a first signal input W and a second signal input IN, which is grounded, and includes two identical inverters INV1 and INV2 comprising transistors P2, N2 and P3, N3 respectively. The gate electrodes of the pair of transistors P2 and N2 as well as those of the pair of transistors P3 and N3 are commoned and constitute the inverter inputs I1 and I2 respectively. Also the drain electrodes of the transistors of these pairs are interconnected and constitute the inverter outputs O1 and O2 respectively. The inverter output O1 is connected to the inverter input I2 and the inverter output O2 is likewise connected to the inverter input I1. A supply voltage VDD=5 Volts is connected to the commoned source electrodes of transistors P2 and P3 via the source-to-drain path of transistor P4 controlled by the pulse waveform O1P. The commoned source electrodes of transistors N2 and N3 are connected to a supply voltage VSS=−5 Volts through the drain-to-source path of transistor N4 which is controlled by the pulse waveform O1N. The signal input W of the comparator CO is connected to the inverter input I1 via the drain-to-source path of transistor N5, whilst the input IN of the comparator is grounded and connected to the other inverter input I2 through the drain-to-source path of transistor N6. Both transistors N5 and N6 are controlled by pulse waveform O2N. The inverter outputs O1 and O2 constitute the comparator outputs. Comparator output O1 is connected to a first inverting input of a NOR-gate G1 whose second inverting input is controlled by pulse waveform O2N, whilst comparator output O2 is connected to a first inverting input of a NOR-gate G2 whose second inverting input is also controlled by O2N. Gates G1 and G2 are identical, gate G2 being used as a dummy and in order that a same load should be connected to each of the outputs O1 and O2. Gate G1 has output Z.

The above mentioned one-bit digital-to-analog converter DAC has input Z and output B and includes switches S15, S3 and S4 which are similar to the above mentioned ones and inverters INV3 and INV4. The input Z is connected to first control inputs of S3 and S4 via S15 and INV3 in series and to second control inputs of these switches through S15, INV3 and INV4 in series, all in such a way that these switches S3 and S4 are controlled in a reverse way. Switches S3 and S4 are able to apply respective reference voltages b=V or b=−V to output B. V and -V are equal to 2.5 Volts and −2.5 Volts respectively.

Before describing the operation of the modulator, the functioning of the converter ADC is considered hereinafter.

During each pulse P2 of O2N and P2 of O2P, both transistors N5 and N6 are conductive. Because N5 is conductive a signal w(t) at the output W of OA2 is then sampled and stored in the parasitic capacitance (not shown) which is present at the inverter input I1 of the comparator CO. Likewise, since N6 is conductive ground is sampled and stored in the parasitic capacitance present at the inverter input I2 of CO.

During each timing pulse P1 of O1N and P1 of O1P, both transistors N4 and P4 are conductive as a consequence of which both the inverters of the comparator CO are operated so that the comparator starts comparing the stored input signal sample and O (ground). By the amplifying action of the inverters INV1 and INV2 which are connected in a loop and depending on the sampled input signal being smaller or larger than $\phi$ a voltage signal VDD (logical 1) or VSS (logical $\phi$) appears at the comparator output O1. This binary output signal is gated in the NOR gate G1 together with the pulse waveform O2N so that the last mentioned output signal only appears as an output signal z at the output Z of this gate G1 during timing pulse P2. Otherwise this output is on $\phi$.

Summarizing, the comparator CO and associated gate G1 operate as a one-bit analog-to-digital converter ADC converting an instantaneous value of the analog signal w(t) into a binary output signal z which is 1 or $\phi$ depending on the sampled value of w(t) being larger or smaller than $\phi$ respectively.

The detailed operation of the above modulator is as follows when assuming that an input signal u(t) is applied to the input U at the time nT and that this input signal has a constant value u(nT) during a whole sampling period T (FIG. 2). It is also supposed that the signals x(t) and w(t) at the outputs X of OA1 and W of OA2 then have the value x(nT) and w(nT) respectively.

During the pulse times P1 of O1N and P1 of O1P the switches S11 and S12 are closed and the transistors N4 and P4 are conductive :

because S11 and S12 are closed the input signal u(nT) is sampled and capacitor C1 is charged between u(nT) and ground in a circuit comprising the series connection S11, C1 and S12;

likewise, since S13 and S14 are closed the signal x(nT) is sampled and capacitor C3 is charged between x(nT) and ground in a circuit constituted by the series connection of S13, C3 and S14;

due to P4 and N4 being conductive the comparator CO is operated so that the value, say w(nT), which has previously been sampled by N5 is converted into a binary value z appearing at the output Z of G1. Because S15 is closed this value z is applied to the converter DAC which then provides at its output a feedback value b=V or b=−V depending on z being 1 or $\phi$ respectively. Indeed, when z=1 switch S3 is closed, whereas switch S4 is closed when z=$\phi$.

During the following pulse time P2 of O2N and P2 of O2P the switches S21 to S24 are closed and the transistors N5 and N6 are conductive:

because S21 and S22 are closed the feedback signal b, equal to V or −V is applied through capacitor C1, which has previously been charged to the value u(nT), to the inverting input of the integrating operational amplifier OA1. At the time (n+1)T the signal x(t) at its output X therefore has the following value:

$$x[(n+1)T] = x(nT) + \frac{C1}{C2}u(nT) - \frac{C1}{C2}b;$$

likewise, since S23 and S24 are closed the feedback signal b is applied through capacitor C3, which has previously been charged to the value x(nT), to the inverting input of the integrating operational amplifier OA2. At the time (n+1)T the signal w(t) at its output W therefore has the following value:

$$w(n+1)T = w(nT) + \frac{C3}{C4}x(nT) - \frac{C3}{C4}b$$

From the above it follows that IM1, IM2, as well as IM3, IM4 operate as a non-inverting integrator for the input signal u(t), x(t) and as an inverting integrator for the feedback signal b. As a consequence the input means IM1 and IM3 may be identical. This is not the case in the above discussed known modulator. Also a complete time interval P2 is used for sampling the feedback signal b and for adding and integrating the input [u(t), x(t)]and feedback signals.

The following features considerably contribute to the accuracy of the modulator :

the input means IM1 and IM2 are independent from stray capacitances since the left hand plate of C1, C3 is switched between effective ground and the virtual ground at the inverting input of OA1, OA2;

the signal u(t) and the feedback signal b are amplified in IM1, IM2 by a same factor C1/C2 and the same is true for the signals x(t) which are amplified in IM3, IM4 by a same factor C3/C4 ;

a whole time interval P1 is used for the operation of the converters ADC and DAC so that the output signal b of DAC is well stabilized before being applied during the immediately following time interval P2 to IM1 and IM3. The same is true for the sampled signals u(t) and x(t).

While the principles of the invention have been described above in connection with specific apparatus, it is to be understood that this description is made only by way of example and not as a limitation on the scope of the invention which is defined by the appended claims.

I claim:

1. A sigma-delta modulator for digitally encoding an analog input signal, comprising:

switched capacitance feedback control circuit means including a cascade connection of switched capacitance signal input means and signal processing means, said input means further including timing means for providing timing signals, a single capacitance means and switching means controlled by said timing means, such that said input means samples and algebraically adds an analog input signal and an analog feedback signal coupled thereto by said processing means;

and such that said processing means includes integration means for integrating said sampled and added input [x(t)] and feedback signals and to provide an analog output signal [w(t)];

a one-bit analog-to-digital converter means providing a digital output signal (z) in response to said analog output signal, and a one-bit digital-to-analog converter means for providing said feedback'signal in response to said output signal [w(t)], said input signal [x(t)] being sampled and wherein said converters being simultaneously operated by and during the first of said timing signals, and during the second of said timing signals said feedback signal is sampled and said input and feedback signals are added and integrated, and whereby said first and second timing signals are non-overlapping and define a sampling period.

2. A sigma-delta modulator according to claim 1, wherein said integration means includes an operational amplifier means having a feedback second capacitance and a non-inverting input connected to a reference voltage;

and said switching means includes a first and a second switch for connecting said input signal and said feedback signal to one plate of said single capacitance means respectively, and a third and a fourth switch for connecting the other plate of said first capacitance means to said reference voltage sand to the inverting input of said operational amplifier respectively, such that said first and third switches are activated by said first timing signals and said second and fourth switches are activated by said second timing signals.

3. A sigma-delta modulator according to claim 1, wherein said one-bit analog-to-digital converter includes.

a sampling circuit means which is activated by said second timing signals for sampling said output signal and a reference signal (ground); and a comparator circuit which is activated by said first timing signals for comparing said sampled output and reference (ground) signals to provide said digital output signal (z).

4. A sigma-delta modulator according to claim 1, wherein said digital-to-analog converter is comprised of a gating circuit means which provides at its output said feedback signal equal either to a second reference signal (V) or to the inverse (−V) thereof when said digital output signal (z) is either 1 or 0 respectively.

5. A sigma-delta modulator according to claim 1, wherein said first and second timing signals each have a duration equal to $\frac{3}{8}$ of a sampling period.

6. A sigma-delta modulator according to claim 1, further including:

second digital input means and second integration means for sampling, adding and integrating a second input signal u(t) and said feedback signal to provide said first input signal.

* * * * *